United States Patent
Roy

(10) Patent No.: US 9,449,707 B2
(45) Date of Patent: Sep. 20, 2016

(54) SYSTEMS AND METHODS TO MITIGATE PROGRAM GATE DISTURB IN SPLIT-GATE FLASH CELL ARRAYS

(71) Applicant: FREESCALE SEMICONDUCTOR, INC., Austin, TX (US)

(72) Inventor: Anirban Roy, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/576,504

(22) Filed: Dec. 19, 2014

(65) Prior Publication Data

US 2016/0180954 A1 Jun. 23, 2016

(51) Int. Cl.
*G11C 16/34* (2006.01)
*G11C 16/10* (2006.01)
*G11C 16/26* (2006.01)
*G11C 16/30* (2006.01)

(52) U.S. Cl.
CPC ............ *G11C 16/3427* (2013.01); *G11C 16/10* (2013.01); *G11C 16/26* (2013.01); *G11C 16/30* (2013.01)

(58) Field of Classification Search
CPC .... G11C 16/3427; G11C 16/26; G11C 16/10
USPC ................ 365/185.18, 185.05; 257/316, 319
See application file for complete search history.

(56) References Cited

U.S. PATENT DOCUMENTS

| | | | |
|---|---|---|---|
| 6,067,254 A | 5/2000 | Kuo et al. | |
| 6,181,607 B1 | 1/2001 | Lee et al. | |
| 6,660,585 B1 | 12/2003 | Lee et al. | |
| 7,443,736 B2 | 10/2008 | Samachisa | |
| 7,466,590 B2 | 12/2008 | Hemink et al. | |
| 2003/0161182 A1* | 8/2003 | Li ..................... | G11C 16/0483 365/185.02 |
| 2004/0027856 A1* | 2/2004 | Lee .................... | G11C 16/0408 365/185.11 |
| 2005/0224865 A1* | 10/2005 | Lee .................... | G11C 16/0475 257/324 |
| 2006/0098505 A1* | 5/2006 | Cho ................... | G11C 16/0425 365/201 |
| 2011/0205808 A1* | 8/2011 | Takahashi .......... | G11C 16/0433 365/185.23 |
| 2015/0170744 A1* | 6/2015 | Jin .................... | G11C 16/0408 365/51 |

OTHER PUBLICATIONS

Suh, K. et al., "A 3.3V MB NAND Flash Memory with Incremental Step Pulse Programming Scheme", 1995 IEEE International Solid-State Circuits Conference, Feb. 15-17, 1995, pp. 128-130.
Suh, K. et al., "A 3.3V MB NAND Flash Memory with Incremental Step Pulse Programming Scheme", 1995 IEEE International Solid-State Circuits Conference, Feb. 15-17, 1995, slides.

* cited by examiner

*Primary Examiner* — Vanthu Nguyen
*Assistant Examiner* — Jerome Leboeuf

(57) ABSTRACT

A memory circuit has control gate circuitry (104) and select gate circuitry (106). A first memory cell (122/124) has a control gate coupled to the control gate circuitry, a select gate coupled to the select gate circuitry, a drain that is coupled to a first bit line for reading a logic state of the of the first memory cell, and a source. A second memory cell (150/152 or 158/160) having a control gate coupled to the control gate circuitry, a select gate coupled to the select gate circuitry, a drain that is coupled to a second bit line for reading a logic state of the of the second memory cell, and a source. A source control circuit (102) that, during programming of the first memory cell, outputs a first voltage to the source of the first memory cell and keeps the source of the second memory cell floating.

20 Claims, 2 Drawing Sheets

SYSTEMS AND METHODS TO MITIGATE PROGRAM GATE DISTURB IN SPLIT-GATE FLASH CELL ARRAYS

BACKGROUND

1. Field

This disclosure relates generally to split-gate flash cell arrays, and more specifically, to systems and methods to mitigate program gate disturb in split-gate flash cell arrays.

2. Related Art

Within a split gate memory cell array, each row of memory cells may be coupled to a control gate driver which drives a required voltage level onto the control gates of the split gate memory cells in accordance with the desired operation. For example, the voltage applied to the control gate of a memory cell depends on whether the desired operation of that memory cell is a program select operation, a program deselect operation, an erase operation, an erase verify operation, a program verify operation, etc. However, this may result in high voltages being applied to other control gates within the array even when the particular memory cell is not the subject of the instant operation. Therefore, a need exists for systems and methods to mitigate program gate disturb in split-gate flash cell arrays.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In certain memory circuit architectures, split gates may be employed. With some split-gate architectures, there may be a disadvantage of applying relatively high voltage levels to memory cells that may not be part of a current memory operation. For example, depending on the memory operation, voltages ranging from 0-9 V may be applied. This may be desirable for the memory cells subject to the operation, but may lead to undesirable levels of disturb for those memory cells that are not immediately subject to the operation. One potential solution to this problem may be to re-engineer a top dielectric layer of the split-gate cells to reduce the level of disturb. However, this may be difficult to achieve and/or increase manufacturing costs.

In some embodiments of the present disclosure, gate disturb may be reduced without having to re-engineer the dielectric layer(s). In some embodiments, unselected sources (e.g., sources of memory cells not immediately subject to a memory operation) are floated rather than supplied with the corresponding operation voltage. For example, when only certain memory cells are being programmed (e.g., with a 9V programming gate voltage), the sources of the memory cells not being programmed may be floated so that the unnecessary voltage is not applied, thus reducing gate disturb.

Figure 1:
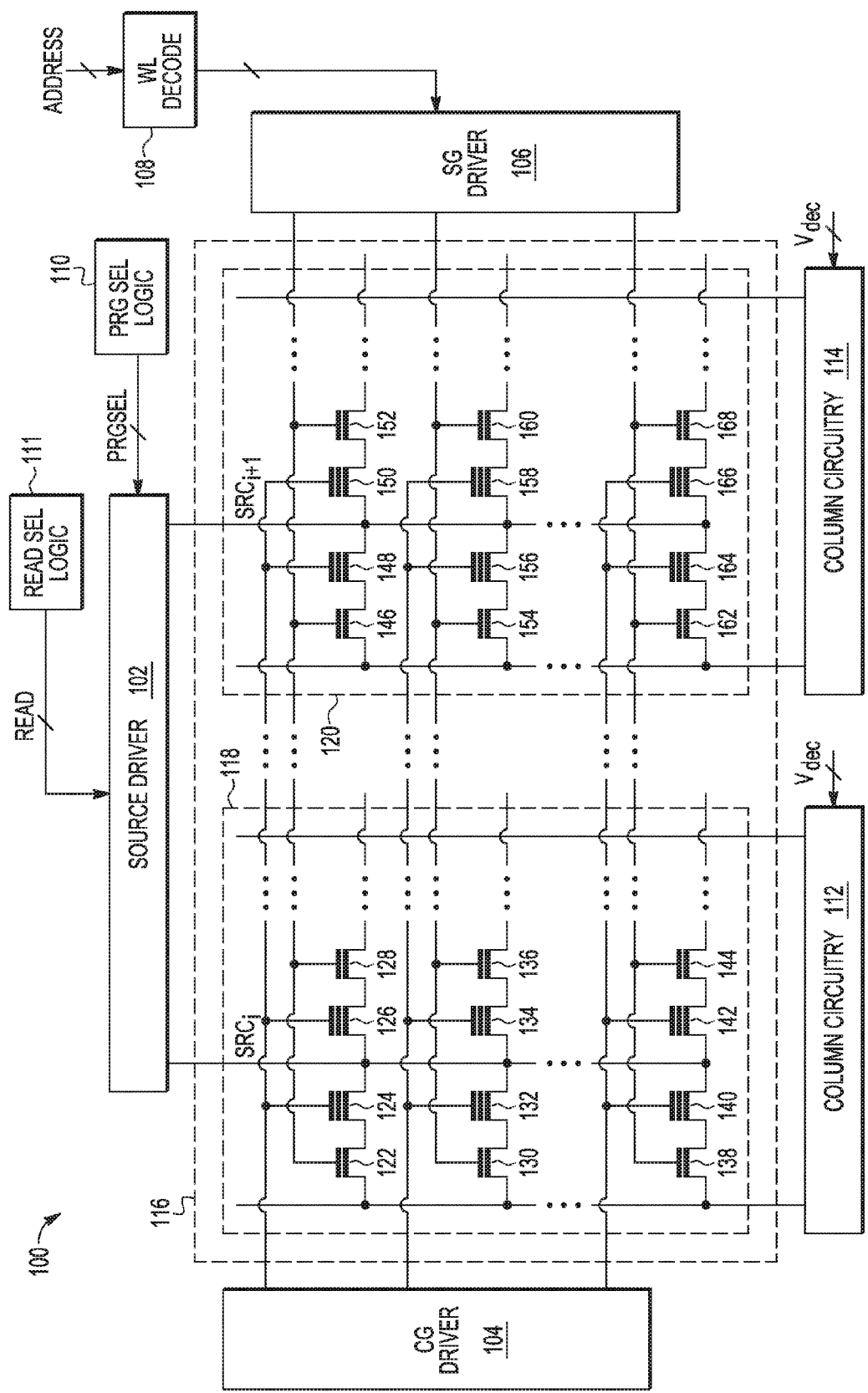
FIG. 1 illustrates an example memory implementing a floating-gate scheme for unselected gates, in accordance with certain embodiments of the present disclosure.

FIG. 1 illustrates an example memory 100 implementing a floating-gate scheme for unselected gates, in accordance with certain embodiments of the present disclosure. Memory 100 may include source driver circuitry 102; control gate driver circuitry 104; select gate driver circuitry 106; word line decoder circuitry 108 coupled to select gate driver circuitry 106; program select logic 110 coupled to source driver circuitry 102; read select logic 111 coupled to source driver circuitry 102; column circuitry 112, 114; and array 116 coupled to source driver circuitry 102, control gate driver circuitry 104, select gate driver circuitry 106, and column circuitry 112, 114.

In some embodiments, array 116 may include one or more segments 118, 120. Although two segments 118, 120 are depicted in FIG. 1, more, fewer, or different segments may be used without departing from the scope of the present disclosure. Each segment 118, 120 may include one or more rows, with each row including one or more memory cells. In the example memory 100, three rows are shown, each containing two memory cells. Although each row is depicted with two memory cells, more, fewer, or different memory cells may be used without departing from the scope of the present disclosure.

In some embodiments, each row of segment 118, 120 may contain a row of memory cells. Each cell may include a plurality of transistors. For example, transistors 122, 124 may constitute one memory cell, as well as transistor pairs 126, 128; 130, 132; 134, 136; 138, 140; 142, 144; 146, 148; 150, 152; 154, 156; 158, 160; 162, 164; and 166, 168. Each memory cell may include a select gate transistor 122, 128, 130, 136, 138, 144, 146, 152, 154, 160, 162, 168 and a control gate transistor 124, 126, 132, 134, 140, 142, 148, 150, 156, 158, 164, 166. The discussion that follows will use as an example a memory cell containing the transistor pairs 122, 124 and 126, 128. Unless otherwise noted, this discussion applied equally to other transistor pairs constituting a memory cell within array 116, 118 (although array 116, 118 may include other memory cells, transistors, and/or other components that are not part of array 116, 118 as herein described).

In some embodiments, transistor 122 may be operable to act as a select gate for a memory cell, and transistor 124 may be operable to act as a control gate for a memory cell. Transistor 124 may, in some embodiments, be an isolated charge storage transistor, incorporating isolated charge storage elements (e.g., silicon nanocrystals) as a storage element.

In some embodiments, transistor 122 may have a control terminal coupled to select gate driver circuitry 106 via a word line, and a drain coupled to a bit line for reading a logic state of the memory cell. Transistor 124 may have a control terminal coupled to control gate driver circuitry 104, and a source coupled to source driver circuitry 102. The other current electrodes of transistors 122, 124 may be coupled to one another. In some embodiments, segments 118, 120 include a plurality of memory cells that may be arranged in rows and columns. For example, segment 118 may be coupled to column circuitry 112, and segment 120 may be coupled to column circuitry 114.

In some embodiments, column circuitry 112, 114 may be operable to select one or more columns of a segment 118, 120. In some embodiments, this may be based on one or more decoded signals communicated to column circuitry 112, 114 as part of a memory operation (e.g., read, program, etc.). The output(s) of column circuitry 112, 114 may be coupled to one or more memory cells via one or more bit lines. Likewise, select gate driver circuitry 106 may be operable to select one or more rows of a segment 118, 120. In some embodiments, this may be based on one or more decoded signals communicated to select gate driver circuitry 106 from word line decode circuitry 108, which receives one or more address signals and decodes the address signals. The output(s) of select gate driver circuitry 106 may be coupled to one or more memory cells via one or more word lines. Through the combination of an active bit line and an active word line, a memory cell may be selected for operation.

In some other split-gate architectures, each memory cell is also coupled to control gate driver 104. Control gate driver 104 may be operable to activate the control gate of a memory cell (e.g., control gate driver 104 is coupled to control gate transistors 124, 126, etc.). Thus even when a memory cell has not been selected by a particular memory operation (e.g., the bit line and word line for that particular memory cell is not active), the control gate of the memory cell may still see some or all of the voltage applied by control gate driver circuitry 104. In the present disclosure, each memory cell includes a source coupled to source driver 102 that may be operable to float the source of a non-selected memory cell so that the control gate is disturbed less by the voltage applied by control gate driver circuitry 104.

In some embodiments, source driver circuitry 102 may be coupled to a source of a control gate transistor of each memory cell in array 116. For example, source driver 102 may be coupled to a source of transistor 124, 126, 132, 134, 140, 142, 148, 150, 156, 158, 164, 166. As described in more detail below with reference to FIG. 2, source driver circuitry 102 may be operable to float the source of a non-selected memory cell. Source driver circuitry 102 may receive as inputs one or more signals associated with a program select logic, as well as one or more signals associated with a read select logic. Source driver circuitry 102 may be coupled to read select logic 111, which may provide one or more read signal(s) (e.g., READ) to source driver circuitry 102 indicating that a read memory operation should be performed for a particular segment 118, 120. Source driver circuitry 102 may also be coupled to program select logic 110, which may provide one or more program select signal(s) (e.g., PrgSel) to source driver circuitry 102 indicating that a program memory operation should be performed for a particular segment 118, 120. Depending on the received signals, source driver circuitry 102 may float a source gate of a non-selected memory cell. In order to accomplish this, source driver circuitry 102 may be operable to provide a voltage level to the control gate transistor sources of each memory cell within a segment 118, 120. If array 116 includes a plurality of segments 118, 120, source driver circuitry 102 may be operable to provide a separate voltage to each segment 118, 120 (e.g., $SRC_i$, $SRC_{i+1}$).

When the source of a non-selected memory cell is floating, gate disturb of the memory cell may be reduced. This may be related to the onset of a deep depletion within a control gate transistor that may be subject to a voltage from control gate driver circuitry 104. The deep depletion may result in a low gate field, thus reducing the program gate disturb at the control gate. This may result in improved efficiencies, particularly with longer lifetimes and better performance for the control gate resistors within array 116.

Figure 2:
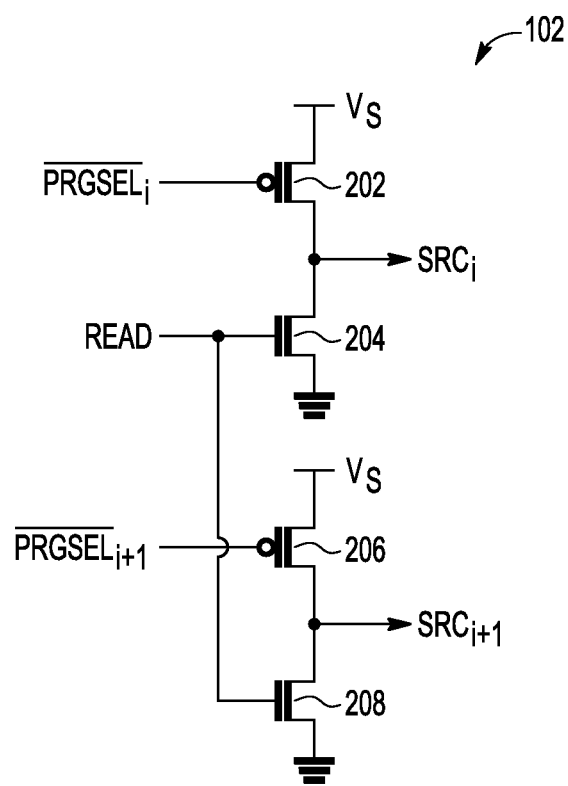
FIG. 2 illustrates an example source driver circuitry, in accordance with certain embodiments of the present disclosure.

FIG. 2 illustrates an example source driver circuitry 102, in accordance with certain embodiments of the present disclosure. Source driver circuitry 102 may include a first transistor 202 coupled to a second transistor 204. In some embodiments transistor 202 may be a p-channel MOSFET, while transistor 204 may be an n-channel MOSFET. In other configurations, more, fewer, or different transistor (and/or other component) configurations may be used without departing from the scope of the present disclosure.

In some embodiments, transistor 202 may include a control electrode coupled to a first program select signal (e.g., $PrgSel_i$ bar). As described in more detail above with reference to FIG. 1, this signal may be communicated to source driver circuitry 102 via program select logic 110. In configurations in which array 116 includes a plurality of segments 118, 120, each segment 118, 120 may have one or more program select signals associated therewith (e.g., $PrgSel_i$ bar, $PrgSel_{i+1}$ bar). Although the illustrated example of FIG. 2 depicts a program select signal that is active low, other configurations could be used without departing from the scope of the present disclosure. Transistor 202 may also include a first current electrode coupled to a first voltage source (e.g., $V_S$), and a second current electrode coupled to an output (e.g., $SRC_i$).

In some embodiments, source driver circuitry 102 may also include transistor 204. Transistor 204 may include a control electrode coupled to a read signal (e.g., READ), a first current electrode coupled to a second voltage source (e.g., ground), and a second current electrode coupled to the second current electrode of transistor 202 and to the output (e.g., $SRC_i$). In such a configuration, a voltage level may be supplied to the output that will allow the source of a transistor coupled to the output to be at the voltage level of the first voltage source when the memory cell is not selected, and the voltage level of the second voltage source when the memory cell is selected for a read operation.

As described in more detail above with reference to FIG. 1, array 116 may include a plurality of segments 116, 118. In such configurations, source driver circuitry 102 may be operable to provide separate source driver signals for each segment 116, 118. For example, source driver circuitry 102 may include a plurality of transistor pairs (e.g., 202, 204; 206, 208), one for each desired source driver signal (e.g., $SRC_i$, $SRC_{i+1}$). In the illustrated example of FIG. 2, source driver circuitry 102 includes two such pairs, but may include more, different, or fewer.

In some embodiments, source driver circuitry 102 may also include transistor 206 coupled to transistor 208. In some embodiments transistor 206 may be a p-channel MOSFET, while transistor 208 may be an n-channel MOSFET. In other configurations, more, fewer, or different transistor (and/or other component) configurations may be used without departing from the scope of the present disclosure.

In some embodiments, transistor 206 may include a control electrode coupled to a second program select signal (e.g., $PrgSel_{i+1}$ bar). As described in more detail above with reference to FIG. 1, this signal may be communicated to source driver circuitry 102 via program select logic 110. In configurations in which array 116 includes a plurality of segments 118, 120, each segment 118, 120 may have one or more program select signals associated therewith (e.g., $PrgSel_i$ bar, $PrgSel_{i+1}$ bar). Although the illustrated example of FIG. 2 depicts a program select signal that is active low, other configurations could be used without departing from the scope of the present disclosure. Transistor 206 may also include a first current electrode coupled to a first voltage source (e.g., $V_S$), and a second current electrode coupled to an output (e.g., $SRC_{i+1}$).

In some embodiments, source driver circuitry 102 may also include transistor 208. Transistor 208 may include a control electrode coupled to a read signal (e.g., READ), a first current electrode coupled to a second voltage source (e.g., ground), and a second current electrode coupled to the second current electrode of transistor 206 and to the output (e.g., $SRC_{i+1}$). In such a configuration, a voltage level may be supplied to the output that will allow the source of a transistor coupled to the output to be at the voltage level of the first voltage source when the memory cell is not selected, and the voltage level of the second voltage source when the memory cell is selected for a read operation.

Although transistors 206, 208 are illustrated as being coupled to the same voltage sources as transistors 202, 204, other voltage sources may be used without departing from the scope of the present disclosure.

The semiconductor substrate described herein can be any semiconductor material or combinations of materials, such as gallium arsenide, silicon germanium, silicon-on-insulator (SOI), silicon, monocrystalline silicon, the like, and combinations of the above.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

By now it should be appreciated that there has been provided various memory circuits, and methods of operating said memory circuits, including control gate circuitry (104), select gate circuitry (106), a first memory cell (122/124) having a control gate coupled to the control gate circuitry, a select gate coupled to the select gate circuitry, a drain that is coupled to a first bit line for reading a logic state of the of the first memory cell, and a source, a second memory cell (150/152 or 158/160) having a control gate coupled to the control gate circuitry, a select gate coupled to the select gate circuitry, a drain that is coupled to a second bit line for reading a logic state of the of the second memory cell, and a source, and a source control circuit (102) that, during programming of the first memory cell, outputs a first voltage to the source of the first memory cell and keeps the source of the second memory cell floating. The first memory cell and the second memory cell may comprise split gate memory cells In some embodiments, the memory circuit may include a select gate of the first memory cell coupled to the select gate circuitry with a first word line and the select gate of the second memory cell (150, 152) coupled to the select gate circuitry with the first word line. In the same or alternative embodiments, the select gate of the first memory cell may be coupled to the select gate circuitry with a first word line and the select gate of the second memory cell (158, 160) may be coupled to the select gate circuitry with a second word line.

In some embodiments, the memory circuit may further include a first plurality of memory cells in a first segment, wherein the first memory cell is in the first segment and each memory cell of the first plurality of memory cells may have a source coupled to the source of the first memory cell, and a second plurality of memory cells in a second segment, wherein the second memory cell is in the second segment and each memory cell of the first plurality of memory cells may have a source coupled to the source of the second memory cell. The sources of the memory cells of the first and second segments may also be coupled to ground during a read of the memory.

In some embodiments, the column circuitry may sense a state of selected memory cells of the first and second segments during a read of the memory. Additionally, during the programming of the first memory cell, the column circuitry may apply a second voltage to the drain of the first memory cell and the first voltage may be greater than the second voltage.

In some embodiments, the source control circuit may include a first p channel transistor having a source coupled to a positive power supply terminal, a gate for receiving a first program signal that is active at a logic low, and a drain coupled to the source of the first transistor, a first n channel transistor having a drain coupled to the drain of the first p channel transistor, a gate for receiving a read signal, and a source coupled to a ground terminal.

In some embodiments, the source control circuit may include a second p channel transistor having a source coupled to a positive power supply terminal, a gate for receiving a second program signal that is active at a logic low, and a drain coupled to the source of the second transistor; and a second n channel transistor having a drain coupled to the drain of the second p channel transistor, a gate for receiving the read signal, and a source coupled to a ground terminal.

Methods of operating the memory circuit may include programming the first memory cell by applying a first voltage to a select gate of the first memory cell, a second voltage to a control gate of the first memory cell, a third voltage to a drain of the first memory cell; and a fourth voltage to a source of the first memory cell; and during the programming the first memory cell, keeping a source of the second memory cell floating.

In some embodiments, the method may further include, during the programming the first memory cells, applying the first voltage to a select gate of the second memory cell; and applying the second voltage to the control gate of the second memory cell. During programming of the second segment, the method may include applying the fourth voltage to the source of the second memory cells and keeping the source of the first memory cell floating.

In some embodiments, when the memory includes a first plurality of memory cells in a first segment (118) wherein the first memory cell is in the first segment and a second plurality of memory cells in a second segment (120) wherein the second memory cell is in the segment, the method may also include, during the programming, keeping sources of the second plurality of memory cells floating. The method may also include, during the programming, keeping sources of the first plurality of memory cells at the fourth voltage. During a read, this may include grounding the sources of the memory cells of the first segment and the second segment.

In some embodiments of the method, the first voltage may include one of a group consisting of a voltage that changes a logic state of the first memory cell and a voltage that does not change the logic state of the first memory cell.

The memory circuit may, in some embodiments, include control gate circuitry (104), select gate circuitry (106), a first segment (118) of memory cells (122/124) wherein each memory cell of the first segment may have a control gate coupled to the control gate circuitry, a select gate coupled to the select gate circuitry, a drain coupled to the column circuitry that receives, during programming of the first segment, a programming input that comprises one of a group consisting of a programming voltage and a non-programming voltage, and a source; a second segment (120) of memory cells (150/152, 158/160) wherein each memory cell of the second segment having a control gate coupled to the control gate circuitry, a select gate coupled to the select gate circuitry, a drain that is coupled to a second bit line for reading a logic state of the second memory cell, and a source; and a source control circuit (102) that, during programming of the first segment, outputs a first voltage to the source of each memory cell of first segment and keeps the source of each memory cell of the second segment floating.

In some embodiments, during programming of the second segment, the drain of each memory cell of the second segment may receive a programming input that comprises one of the group consisting of the programming voltage and the non-programming voltage; and the source control circuit may output the first voltage to the source of each memory cell of second segment and keeps the source of each memory cell of the first segment floating. The first segment may include a first row (122/124) of memory cells, the second segment may include a second row (146/148) of memory cells, and a word line may be coupled from the select gate driver to the select gates of the memory cells of the first segment and the second segment.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, array 116 may include more, fewer, or different segments than those illustrated in FIG. 1, and each segment 118, 120 may include more, fewer, or different memory cells than those illustrated in FIG. 1. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory circuit, comprising:
control gate circuitry;
select gate circuitry;
a first memory cell having a control terminal of a control gate coupled to the control gate circuitry, a control terminal of a select gate coupled to the select gate circuitry, a drain of the select gate that is coupled to a first bit line for reading a logic state of the of the first memory cell, and a source of the control gate;
a second memory cell having a control terminal of a control gate coupled to the control gate circuitry, a control terminal of a select gate coupled to the select gate circuitry, a drain of the select gate that is coupled to a second bit line for reading a logic state of the of the second memory cell, and a source of the control gate; and
a source control circuit that, during programming of the first memory cell, outputs a first voltage to the source of the control gate of the first memory cell and keeps the source of the control gate of the second memory cell floating.

2. The memory circuit of claim 1, wherein:
the control terminal of the select gate of the first memory cell is coupled to the select gate circuitry with a first word line; and
the control terminal of the select gate of the second memory cell is coupled to the select gate circuitry with the first word line.

3. The memory circuit of claim 1, wherein:
the control terminal of the select gate of the first memory cell is coupled to the select gate circuitry with a first word line; and
the control terminal of the select gate of the second memory cell is coupled to the select gate circuitry with a second word line.

4. The memory circuit of claim 1, further comprising:
a first plurality of memory cells in a first segment, wherein the first memory cell is in the first segment and each memory cell of the first plurality of memory cells has a control gate source coupled to the source of the control gate of the first memory cell; and
a second plurality of memory cells in a second segment, wherein the second memory cell is in the second segment and each memory cell of the first second plurality of memory cells has a control gate source coupled to the source of the control gate of the second memory cell.

5. The memory circuit of claim 4, wherein the control gate sources of the memory cells of the first and second segments are coupled to ground during a read of the memory.

6. The memory circuit of claim 1, wherein column circuitry senses a state of selected memory cells of the first and second segments during a read of the memory.

7. The memory circuit of claim 1, wherein, during the programming of the first memory cell, the select gate circuitry applies a second voltage to the drain of the select gate of the first memory cell and the first voltage is greater than the second voltage.

8. The memory circuit of claim 1, wherein the source control circuit comprises:
a first p channel transistor having a source coupled to a positive power supply terminal, a gate for receiving a first program signal that is active at a logic low, and a drain coupled to the source of the control gate of the first memory cell;
a first n channel transistor having a drain coupled to the drain of the first p channel transistor, a gate for receiving a read signal, and a source coupled to a ground terminal.

9. The memory circuit of claim 1, wherein the source control circuit further comprises:
a second p channel transistor having a source coupled to a positive power supply terminal, a gate for receiving a second program signal that is active at a logic low, and a drain coupled to the source of the control gate of the second memory cell; and
a second n channel transistor having a drain coupled to the drain of the second p channel transistor, a gate for receiving the read signal, and a source coupled to a ground terminal.

10. The memory circuit of claim 1, wherein the first memory cell and the second memory cell comprise split gate memory cells.

11. A method of operating a memory circuit having a first memory cell and a second memory cell, comprising:
programming the first memory cell by applying a first voltage to a control terminal of a select gate of the first memory cell, a second voltage to a control terminal of a control gate of the first memory cell, a third voltage to a drain of the select gate of the first memory cell; and a fourth voltage to a source of the control gate of the first memory cell; and
during the programming the first memory cell, keeping a source of a control gate of the second memory cell floating.

12. The method of claim 11, further comprising, during the programming the first memory cell:
applying the first voltage to a control terminal of a select gate of the second memory cell; and
applying the second voltage to a control terminal of the control gate of the second memory cell.

13. The method of claim 12, further comprising, during programming of the second segment:
applying the fourth voltage to the source of the control gate of the second memory cell and keeping the source of the control gate of the first memory cell floating.

14. The method of claim 11, wherein the memory circuit further comprises a first plurality of memory cells in a first segment wherein the first memory cell is in the first segment and a second plurality of memory cells in a second segment wherein the second memory cell is in the second segment, further comprising:
during the programming, keeping sources of the control gates of the second plurality of memory cells floating.

15. The method of claim 14, further comprising:
during the programming, keeping sources of the control gates of the first plurality of memory cells at the fourth voltage.

16. The method of claim 15, further comprising:
during a read, grounding the sources of the control gates of the memory cells of the first segment and the second segment.

17. The method of claim 11, wherein the first voltage comprises one of a group consisting of a voltage that changes a logic state of the first memory cell and a voltage that does not change the logic state of the first memory cell.

18. A memory circuit, comprising:
control gate circuitry;
select gate circuitry;
a first segment of memory cells wherein each memory cell of the first segment having a control terminal of a control gate coupled to the control gate circuitry, a control terminal of a select gate coupled to the select gate circuitry, a drain of the select gate coupled to column circuitry that receives, during programming of the first segment, a programming input that comprises one of a group consisting of a programming voltage and a non-programming voltage, and a source of the control gate;
a second segment of memory cells wherein each memory cell of the second segment having a control terminal of a control gate coupled to the control gate circuitry, a control terminal of a select gate coupled to the select gate circuitry, a drain of the select gate that is coupled to a second bit line for reading a logic state of the of the second memory cell, and a source of the control gate; and
a source control circuit that, during programming of the first segment, outputs a first voltage to the source of the control gate of each memory cell of the first segment and keeps the source of the control gate of each memory cell of the second segment floating.

19. The memory circuit of claim 18, wherein during programming of the second segment:
the drain of the select gate of each memory cell of the second segment receives a programming input that comprises one of the group consisting of the programming voltage and the non-programming voltage; and
the source control circuit outputs the first voltage to the source of the control gate of each memory cell of the second segment and keeps the source of the control gate of each memory cell of the first segment floating.

20. The memory circuit of claim 19 wherein the first segment comprises a first row of memory cells, the second segment comprises a second row (146/148) of memory cells, a word line is coupled from the select gate circuitry to the control terminals of the select gates of the memory cells of the first segment and the second segment.

* * * * *